(12) United States Patent
Kawamura et al.

(10) Patent No.: US 6,251,192 B1
(45) Date of Patent: *Jun. 26, 2001

(54) VACUUM EXHAUST SYSTEM

(75) Inventors: Takeshi Kawamura, Kawasaki; Yasuhiro Niimura, Ayase, both of (JP)

(73) Assignee: Ebara Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/252,236

(22) Filed: Feb. 18, 1999

(30) Foreign Application Priority Data

Feb. 18, 1998 (JP) ................................. 10-052984

(51) Int. Cl.⁷ .................................................. C23C 16/00
(52) U.S. Cl. ............................................................ 118/719
(58) Field of Search ................................. 118/715, 719; 156/345

(56) References Cited

U.S. PATENT DOCUMENTS

| 4,725,204 | 2/1988 | Powell ................................. 118/715 |
| 5,190,438 | 3/1993 | Taniyama et al. ..................... 415/90 |
| 5,388,944 | 2/1995 | Takanabe et al. .................... 414/217 |
| 5,443,644 | 8/1995 | Ozawa ................................. 118/715 |
| 5,556,473 | * 9/1996 | Olson et al. .......................... 118/719 |
| 5,558,717 | 9/1996 | Zhao et al. ........................... 118/715 |
| 5,672,322 | 9/1997 | Visser ................................... 422/168 |
| 5,685,963 | 11/1997 | Lorimer et al. ...................... 118/719 |
| 5,707,451 | 1/1998 | Robles et al. ........................ 118/715 |
| 5,855,681 | 1/1999 | Maydan et al. ...................... 118/719 |
| 5,873,942 | 2/1999 | Park et al. ............................ 118/719 |
| 5,902,088 | 5/1999 | Fairbairn et al. .................... 414/217 |
| 5,913,978 | 6/1999 | Kato et al. ........................... 118/719 |

FOREIGN PATENT DOCUMENTS 05047695  2/1993 (JP) .

* cited by examiner

*Primary Examiner*—Gregory Mills
*Assistant Examiner*—Sylvia R. MacArthur
(74) *Attorney, Agent, or Firm*—Armstrong, Westerman, Hattori, McLeland, & Naughton, LLP

(57) ABSTRACT

A vacuum exhaust system can improve the operating efficiency of the vacuum exhaust system while reducing the system cost, to quickly attain a vacuum in the auxiliary chambers without increasing the size of the vacuum pumps. The vacuum exhaust system comprises a first pumping section and a second pumping section disposed downstream of and in series with the first pumping section. A main exhaust passage is provided to communicate a main chamber with a suction port of the first pumping section, and an auxiliary exhaust passage is provided to communicate an auxiliary chamber with a suction port of the second pumping section.

8 Claims, 4 Drawing Sheets

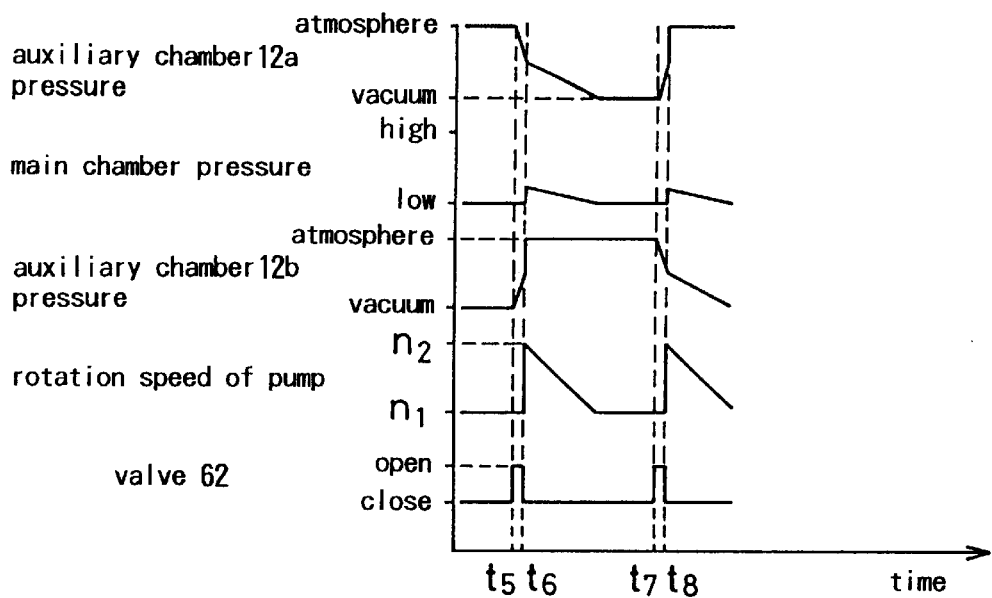
F I G. 5
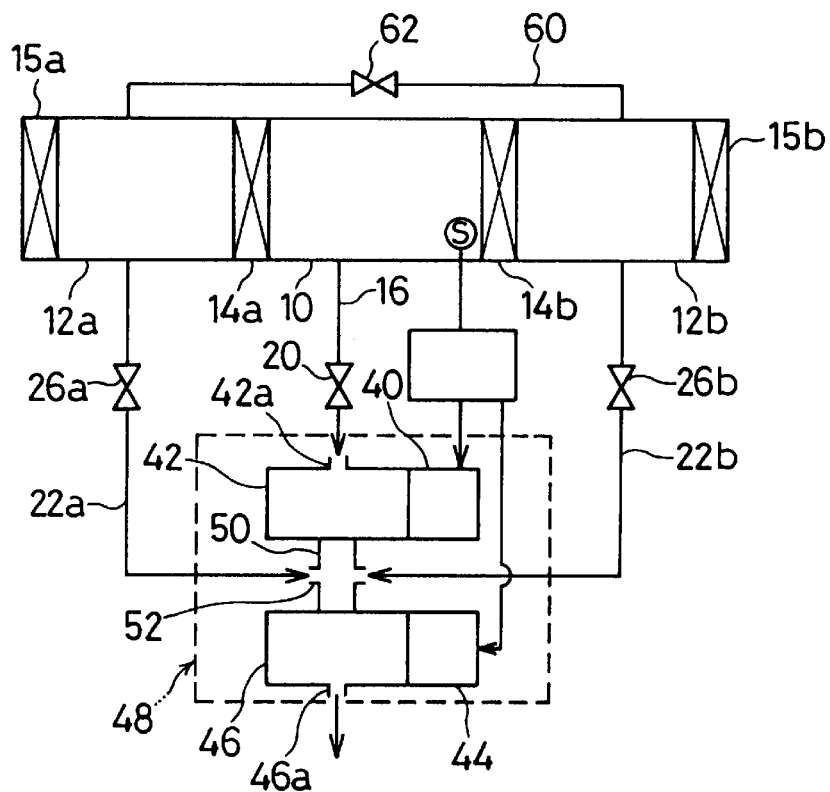
F I G. 6

VACUUM EXHAUST SYSTEM

BACKGROUND OF THE INVENTION

1. Field of the Invention

The present invention relates to a vacuum exhaust system for use in evacuating a processing chamber for advanced products such as semiconductor devices, for example.

2. Description of the Related Art

A conventional arrangement of a vacuum exhaust system used in semiconductor device manufacturing processes to evacuate a processing chamber for carrying out such process as etching and chemical vapor deposition (CVD) of semiconductor wafers is shown in FIG. 8. A main chamber (processing chamber)10 is connected on both sides to auxiliary chambers (load lock chambers) 12a, 12b, for loading and unloading purposes through respective gates 14. Each auxiliary chamber 12a, 12b is isolated from, or open to, the external environment by a gate 15.

The main chamber 10 is connected to a vacuum pump 18 through an exhaust path 16 having a valve 20, and each auxiliary chamber 12a, 12b is connected similarly to a vacuum pump 24 through an exhaust path 22 having a valve 26. It has been customary to use rotary oil pumps for the vacuum pumps 18, 24, but lately, dry pumps are used primarily for this type of work.

In this type of apparatus, in order to access the main chamber 10 while it is under vacuum, loading or unloading of a workpiece into the main chamber 10 requires that an auxiliary chamber 12 be evacuated first, and the gate 14 opened next so as to avoid exposing the main chamber 10 to external atmosphere. This is done to prevent the main chamber 10 and associated piping from contamination as well as to improve productivity by shortening the time for re-starting.

In such conventional systems, a vacuum pump is provided for each chamber to evacuate individual chambers, therefore, working efficiency of each vacuum pump is low. If the number of main chambers 10 is increased in an effort to raise productivity, it leads to a problem that the number of vacuum pumps needs to be increased, leading ultimately to a large size facility and higher running costs. If an attempt is made to shorten the time for evacuating the auxiliary chambers, a higher capacity for each pump is required, thus aggravating the above problems even further.

SUMMARY OF THE INVENTION

It is an object of the present invention to provide a vacuum exhaust system to enable as much sharing of vacuum pumps as possible, to improve the operating efficiency of the vacuum exhaust system while reducing the system cost, or to quickly attain a vacuum in the auxiliary chambers without increasing the size of the vacuum pumps.

The object has been achieved in a vacuum exhaust system for evacuating a main chamber and at least one associated auxiliary chamber comprising: a first pumping section; a second pumping section disposed downstream of and in series with the first pumping section; a main exhaust passage communicating the main chamber with a suction port of the first pumping section; at least one auxiliary exhaust passage communicating the auxiliary chamber with a suction port of the second pumping section.

Accordingly, the main chamber can be evacuated with two pumping sections arranged in series, and the auxiliary chambers are evacuated with one of the pumping sections, thereby increasing the operating efficiency of each pumping section while keeping the capacity of each pump as small as practicable.

The first and second pumping sections may share a common drive motor. Accordingly, one multi-stage vacuum pump can manage the task of evacuating an entire processing system so that the number of vacuum pumps can be reduced compared with a case of providing a vacuum pump for each auxiliary chamber. However, the first pumping section and the second pumping section may be provided with individual drive sections.

The pumping sections may be controlled so as to obtain a minimum fluctuation in pressure, according to a pressure measured inside the main chamber. Accordingly, pressure changes can be held to a minimum in the main chamber which is an important chamber for processing advanced products such as semiconductor devices.

Another aspect of the invention is a vacuum exhaust system for evacuating a main chamber and a plurality of associated auxiliary chambers, the plurality of auxiliary chambers having a connecting passage connecting each other which can be opened or closed to equalize pressure in the auxiliary chambers. Accordingly, vacuum environment present inside an auxiliary chamber can be utilized to lower the pressure of another auxiliary chamber which may be at an atmospheric pressure so that evacuation time can be significantly reduced to improve the operating efficiency of the overall evacuation operation.

BRIEF DESCRIPTION OF THE DRAWINGS

FIG. 5 is a time-chart showing the control steps for the second system shown in FIG. 4;

FIG. 6 is a variation of the second system;

DETAILED DESCRIPTION OF THE PREFERRED EMBODIMENTS

Preferred embodiments will be presented in the following with reference to the drawings.

Figure 1:
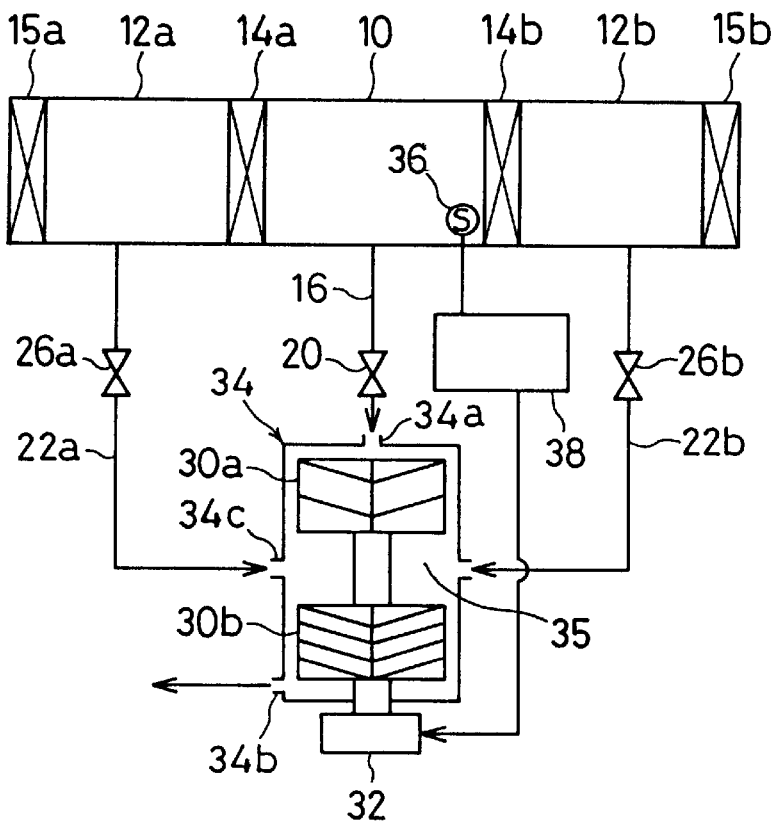
FIG. 1 is a schematic diagram of a first embodiment of the vacuum exhaust system of the present invention.
Figure 2:
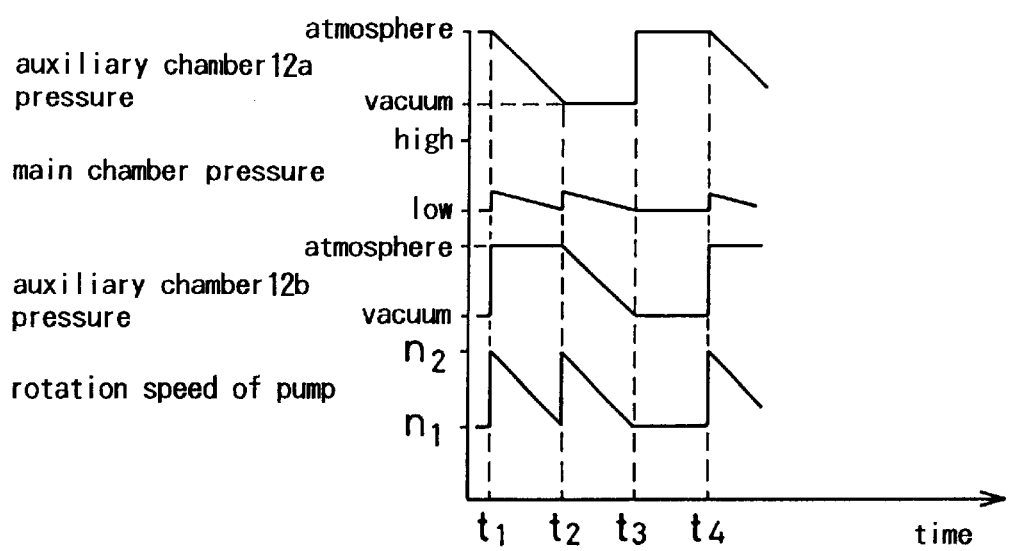
FIG. 2 is a time-chart showing the control steps for the first system shown in FIG. 1.

FIGS. 1 and 2 relate to a first embodiment of the vacuum exhaust system of the present invention, which includes, as in the conventional systems, a main chamber 10 for carrying out processes such as etching and CVD of semiconductor wafers. An auxiliary chamber 12a is attached, through a gate 14a, to the main chamber 10 on the loading-side, and an auxiliary chamber 12b is attached, through a gate 14b, to the main chamber 10 on the unloading-side. Each of the auxiliary chambers 12a, 12b is isolated from and connected to the outside atmosphere through respective gates 15a, 15b.

To exhaust three chambers 10, 12a, 12b, one two-stage pump 34 is used. The two-stage pump 34 has a first pumping section 30a on the upstream side, and a second pumping section 30b on the downstream side. The pumping sections 30a, 30b share a common shaft connected to a variable-speed motor 32. The two-stage pump 34 is provided with a suction port 34a, and an exhaust port 34b, and an intermediate port 34c opening at a location between the pumping sections 30a, 30b. The exhaust passage 16 for the main chamber 10 is connected through a valve 20 to the suction port 34a, and the exhaust passages 22a, 22b, respectively, for auxiliary chambers 12a, 12b, are connected though respective valves 26a, 26b to the intermediate port 34c.

As shown in FIG. 2, performance of the two-stage pump 34 is designed so as to enable exhaustion of the main chamber 10 at a first rotation speed $n_1$, and to enable exhaustion of the main chamber 10 and one of the auxiliary chamber 12a, 12b concurrently at a second rotation speed $n_2$ which is larger than $n_1$. This exhaustion system is provided with a control section 38 to control the operating parameters, such as on/off and rotational speed, for the variable speed motor 32 according to an output signal from a pressure sensor 36 provided inside the main chamber 10. Speed control can be effected by following a certain re-selected pattern in sequence or by feedback control to follow signals output from the sensor 36.

Operation of the vacuum exhaust system in first embodiment will be explained with reference to FIG. 2 showing the time-sequence of a processing workpiece. First, the gate 15a is opened to load the workpiece into the auxiliary chamber 12a, and the gate 15a is closed. Next, valves 26a, 20 are opened and the pump 34 is operated at the higher second speed $n_2$, and the rotation speed is gradually reduced back to the first speed $n_2$, during a time interval ($t_1$~$t_2$) so that the auxiliary chamber 12a and the main chamber 10 are both evacuated. After the main chamber 10 reaches a required pressure, workpiece processing operation can be started.

While the processing is proceeding in the main chamber 10, the auxiliary chamber 12b will also be evacuated. The pump 34 is operated at the higher second speed $n_2$ and the rotation speed is gradually reduced back to the first speed $n_1$ during a time interval ($t_2$~$t_3$). After the auxiliary chamber 12b is exhausted, the pump 34 is operated at the first speed $n_1$ to complete the processing in the main chamber 10 during a time interval ($t_3$~$t_4$).

Next, the gate 14b is opened to unload the processed workpiece from the main chamber 10 to the auxiliary chamber 12b at time $t_4$. During the processing interval in the main chamber 10, a new workpiece is placed inside the auxiliary chamber 12b by opening the gate 15a, so that the interior pressure is at an atmospheric pressure. At this point, the steps from time $t_1$ are repeated. In the meantime, the gate 15b is opened to remove the processed workpiece from inside the auxiliary chamber 12b.

By following the steps described above, the embodied exhaustion system enables to operate the system with one pump by suitably switching the evacuation process among the main chamber and the auxiliary chambers thereby reliably maintaining the required load locking functions. And since the emphasis is placed on exhausting the main chamber by using a multi-stage pump, lowering of gas exhausting capability of the main chamber is avoided.

In the above case, although the rotation speed was controlled sequentially according to a pre-determined pattern, it is permissible to use a feedback control according to signals output from a pressure sensor 36. When valves 26a, 20 are opened to evacuate the auxiliary chamber 12a and the main chamber 10, opening of the valve 26a causes the pressure in the mid-chamber 35 of the pump 34 to increase, and the pump capacity is lowered so that the interior pressure in the main chamber 10 is also increased. To avoid such critical pressure fluctuation in the main chamber 10, the interior pressure can be monitored by a pressure sensor 36 so as to control the rotation-speed of the pump 34 at a speed between the second speed $n_2$ and the first speed $n_1$.

Figure 3:
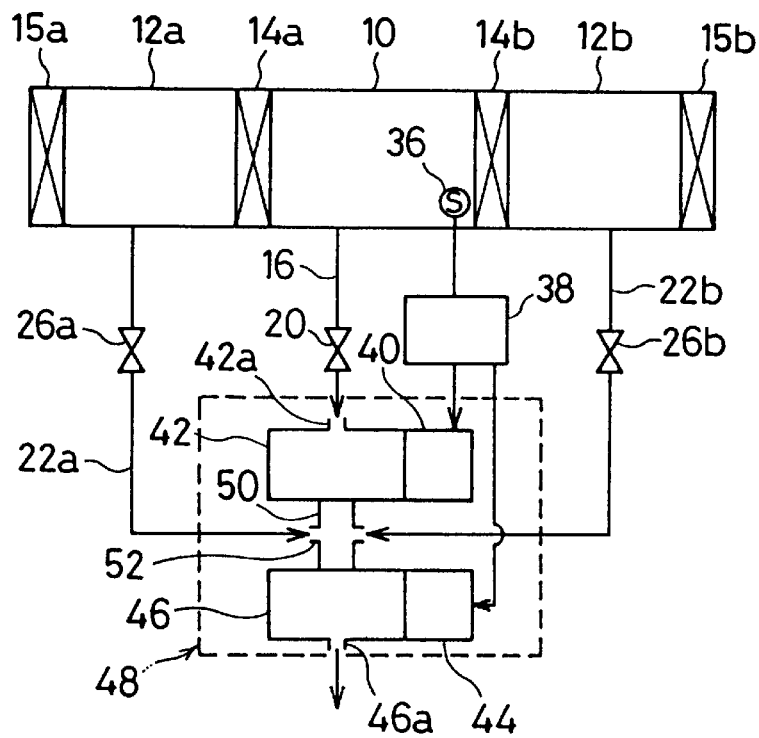
FIG. 3 is a schematic diagram of a variation of the first system.

FIG. 3 shows a variation of the first embodiment, which uses two individual pumps connected in series. A first stage booster pump 42 is connected in series with a second stage main pump 46. Each pump is driven by separate variable speed motors 40, 44, whose speeds can be controlled separately by a control section 38.

The exhaust passage 16 of the main chamber 10 is connected through a valve 20 to a suction port 42a of the booster pump 42, and the exhaust port of booster pump 42 and the suction port of main pump 46 are connected through a connecting pipe 50 having an intermediate port 52. The exhaust passages 22a, 22b of the auxiliary chambers 12a, 12b are connected through the valves 26a, 26b to the intermediate port 52. Operational characteristics of this embodiment system are the same as those in the first case, and their explanations will be omitted.

In this example also, the rotation speed of the pump can be feedback controlled using the output signals from a pressure sensor 36. In this example, rotation speed of main pump 46 and booster pump 42 can be controlled independently to enable more precise control of the pressure.

Figure 4:
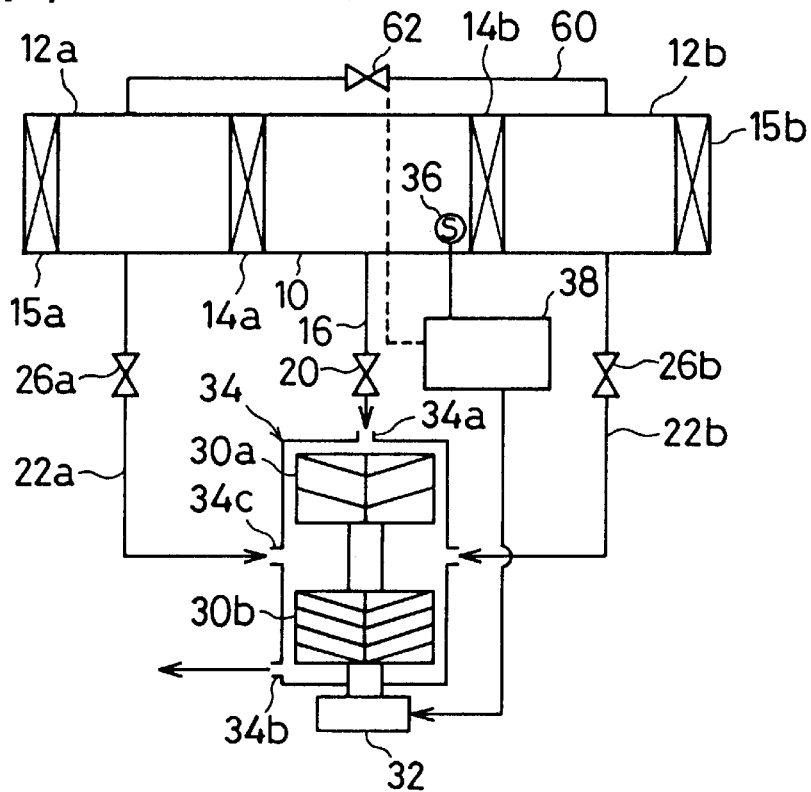
FIG. 4 is a schematic diagram of another embodiment of the vacuum exhaust system of the present invention.

FIG. 4 is a schematic diagram of another embodiment of the vacuum exhaust system. This system includes: a connecting passage 60 to connect both auxiliary chambers 12a, 12b shown in FIG. 1 to equalize the vacuum pressure; and a valve 62 for opening or closing the connecting passage 60. The valve 62 is controlled by a control section 38 to open in advance when either the auxiliary chamber 12a or 12b is exhausted.

The embodied vacuum exhaust system is used, for example, when exhausting the auxiliary chamber 12a after it has been loaded with a workpiece so that it is at an atmospheric pressure, in a way that the valve 62 is opened before the valve 26a is opened to evacuate with the multistage pump 34 (at time $t_5$). At this time, the auxiliary chamber 12b has a processed workpiece passed from the main chamber so that its interior pressure is maintained at some low pressure. Therefore, by opening the valve 62, air flows from the auxiliary chamber 12a to auxiliary chamber 12b so that both chambers attain a common pressure intermediate between an atmospheric pressure and vacuum.

After this stage, valve 62 is closed, and as in FIG. 1, pump 34 is operated at a higher second speed $n_2$ (at time $t_6$) to exhaust both auxiliary chamber 12a and main chamber 10. In this case, because the initial pressure in the auxiliary chamber is less than an atmospheric pressure, the length of time required to exhaust the auxiliary chamber is reduced compared with the system shown in FIG. 1. In the auxiliary chamber 12b, gate 15b is opened and the processed workpiece is withdrawn. This system thus allows to utilize the reduced-pressure environment of the auxiliary chamber 12b, which is normally discarded to waste, to shorten the evacuation time of the auxiliary chamber 12a. This feature further contributes to increasing the operating efficiency of the overall vacuum exhaust system.

Similarly, when exhausting the auxiliary chamber 12b, valve 62 is first opened temporarily (time $t_7$) to introduce the vacuum environment in the auxiliary chamber 12a before an unprocessed workpiece has been loaded into the auxiliary chamber 12b (time $t_7$~$t_8$) so that auxiliary chamber 12b can be reduced in pressure, and then the multi-stage pump 34 is operated at a fast speed. Thus, the exhaustion time for the auxiliary chamber 12b can be shortened.

FIG. 6 shows a variation of the system shown in FIG. 4. This system is based on the variation based on the third embodiment shown in FIG. 3, and includes a connecting path 60 and a valve 62 which is designed to be opened before evacuating either of the auxiliary chamber 12a or 12b.

Figure 7:
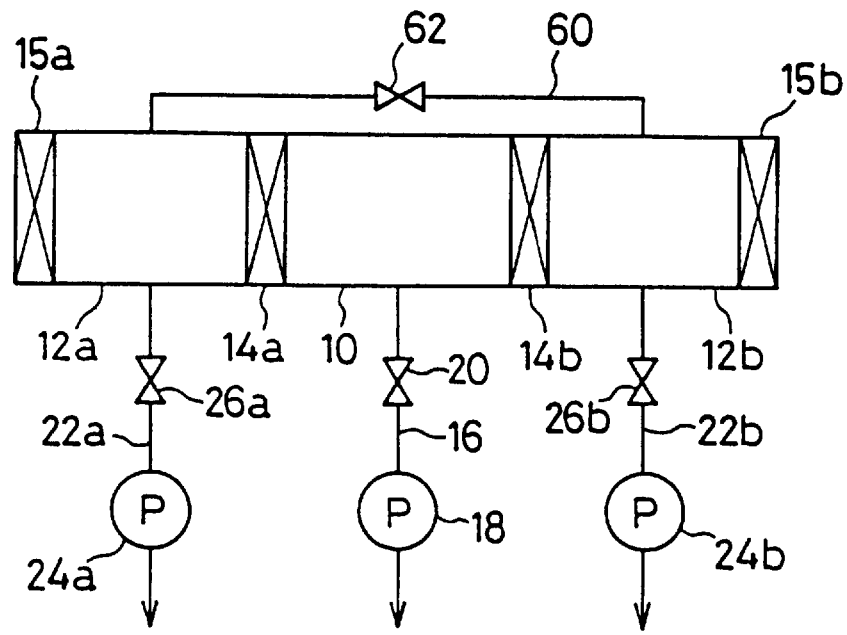
FIG. 7 is a schematic diagram of a third embodiment of the vacuum exhaust system of the present invention.
Figure 8:
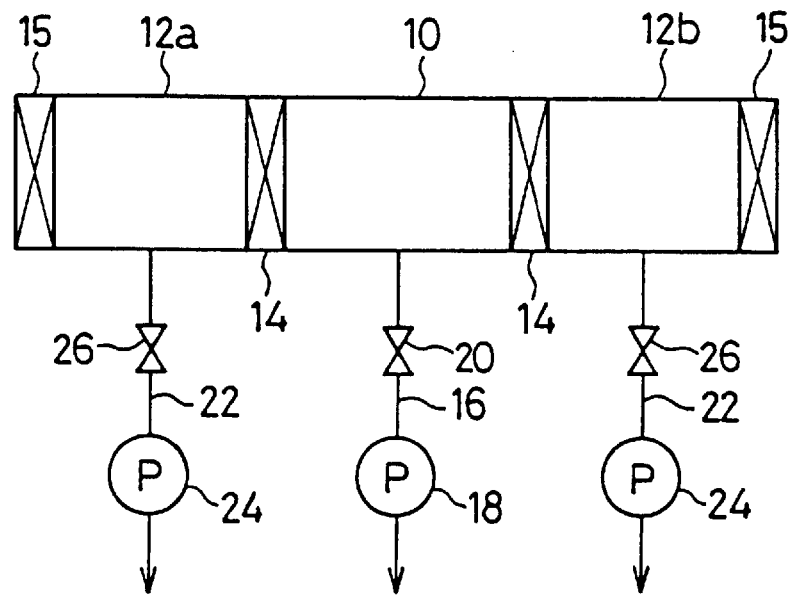
FIG. 8 is a schematic diagram of a conventional vacuum exhaust system.

FIG. 7 shows a third embodiment, and includes auxiliary chambers 12a, 12b having dedicated exhaust passages 22a, 22b, provided with respective vacuum pump 24a, 24b respectively, connected with connecting passage 60, and within the connecting passage 60, a valve 62 which is designed to open prior to evacuating either auxiliary chamber 12a or 12b. This system also enables to utilize waste vacuum, as in the systems shown in FIGS. 3 and 6, to shorten the exhaustion time required to evacuate the auxiliary chambers 12a, 12b.

What is claimed is:

1. A vacuum exhaust system for evacuating a main chamber and at least one associated auxiliary chamber comprising:

a first pumping section;

a second pumping section disposed downstream of and in series with said first pumping section;

a main exhaust passage allowing said main chamber to communicate with a suction port of said first pumping section; and at least one auxiliary exhaust passage allowing said auxiliary chamber to communicate with a suction port of said second pumping section;

wherein said main chamber comprises a processing chamber and said auxiliary chamber comprises a load lock chamber, and said processing chamber and said load lock chamber are connected to each other through a gate so that a workpiece is loaded to said processing chamber from said load lock chamber and processed in said processing chamber, and including means operative while said workpiece is processed, to simultaneously operate said first pumping section and said second pumping section to evacuate said processing chamber.

2. A vacuum exhaust system according to claim 1, wherein said at least one auxiliary exhaust passage comprises a shut-off valve.

3. A vacuum exhaust system according to claim 1, wherein said first pumping section and said second pumping section share a common drive motor to constitute a multi-stage vacuum pump.

4. A vacuum exhaust system according to claim 1, wherein said first pumping section and said second pumping section are individually provided with respective drive sections.

5. A vacuum exhaust system according to claim 1, further comprising a control section for controlling rotation speed of said first or second pumping sections so as to obtain a minimum fluctuation in pressure, according to a pressure measured inside said main chamber.

6. A vacuum exhaust system according to claim 1, wherein a plurality of said auxiliary chambers are provided for said main chamber.

7. A vacuum exhaust system according to claim 6, wherein said plurality of auxiliary chambers have a connecting passage connecting each other which can be opened or closed to equalize pressure in said auxiliary chambers.

8. A vacuum exhaust system according to claim 7, further comprising a control section for controlling said connecting passage to open and close before one of said auxiliary chambers are evacuated.

* * * * *